(12) United States Patent
Jung

(10) Patent No.: US 8,153,518 B2
(45) Date of Patent: Apr. 10, 2012

(54) METHOD FOR FABRICATING METAL INTERCONNECTION OF SEMICONDUCTOR DEVICE

(75) Inventor: Chung-Kyung Jung, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 192 days.

(21) Appl. No.: 12/638,129

(22) Filed: Dec. 15, 2009

(65) Prior Publication Data

US 2010/0167524 A1    Jul. 1, 2010

(30) Foreign Application Priority Data

Dec. 26, 2008   (KR) .................. 10-2008-0134033

(51) Int. Cl.
*H01L 21/4763* (2006.01)

(52) U.S. Cl. ........ 438/624; 438/629; 438/637; 438/638; 438/906; 257/E21.575

(58) Field of Classification Search .................. 438/624, 438/622, 627, 629, 637–638, 712, 725, 906; 257/E21.575
See application file for complete search history.

(56) References Cited

U.S. PATENT DOCUMENTS

| 6,457,477 | B1 * | 10/2002 | Young et al. | 134/1.2 |
| 7,922,824 | B2 * | 4/2011 | Minsek et al. | 134/1.3 |
| 2005/0112899 | A1 * | 5/2005 | Shim | 438/706 |
| 2006/0046465 | A1 * | 3/2006 | Shim | 438/622 |
| 2009/0142931 | A1 * | 6/2009 | Wang et al. | 438/734 |

* cited by examiner

*Primary Examiner* — Michael Trinh
(74) *Attorney, Agent, or Firm* — Sherr & Vaughn, PLLC

(57) ABSTRACT

In a method for fabricating a metal interconnection of a semiconductor device, a lower interconnection and a lower insulation layer are formed over a semiconductor substrate. An etch stop layer is formed over the lower insulation layer. An upper insulation layer is formed over the etch stop layer. A first via hole is formed to expose the etch stop layer corresponding to the lower interconnection. A second via hole exposing the lower interconnection is formed by a primary etching process that selectively removes the etch stop layer exposed by the first via hole. A chemical cleaning process is performed on the second via hole, wherein polymer is formed over the surface of the lower interconnection during the chemical cleaning process. The polymer is removed from the second via hole by a secondary etching process using vaporized gas.

12 Claims, 3 Drawing Sheets

METHOD FOR FABRICATING METAL INTERCONNECTION OF SEMICONDUCTOR DEVICE

Figure 1:
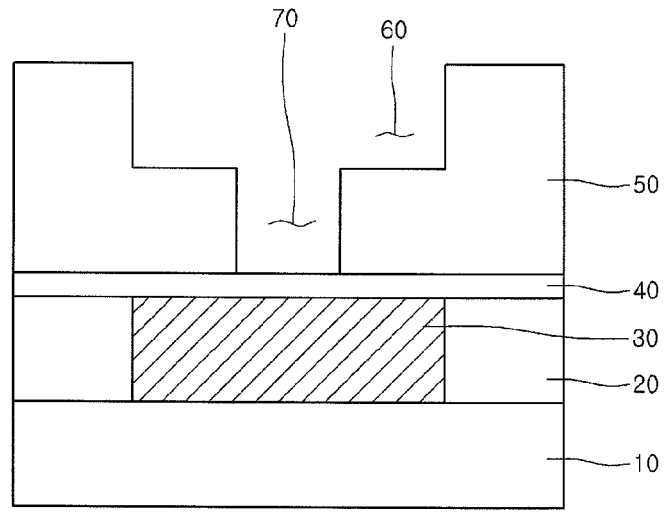

The present application claims priority under 35 U.S.C. 119 to Korean Patent Application No. 10-2008-0134033 (filed on Dec. 26, 2008), which is hereby incorporated by reference in its entirety.

BACKGROUND

The present disclosure relates to a method for fabricating a metal interconnection of a semiconductor device. As semiconductor device fabrication technology develops, semiconductor devices have become smaller and more highly integrated. While semiconductor devices are fabricated according to 130-nm and 90-nm design rules, semiconductor device fabrication technology meeting 65-nm or 45-nm design rules have been developed.

Due to the higher integration of semiconductor devices, interconnections have been made smaller. Increasing interest has focused on copper interconnections. Copper interconnections have lower resistance and higher electro-migration than aluminum or aluminum alloy interconnections. Copper interconnections may be fabricated using a "Damascene process."

A damascene process is a process that forms a trench and a via hole exposing a lower interconnection in an insulation layer, deposits a copper layer within the trench and the via hole, and planarizes the copper layer through a chemical mechanical polishing (CMP) process to form a copper interconnection. In particular, since an etch stop layer on the lower interconnection is formed of nitride, the lower interconnection must be exposed by selectively removing the etch stop layer after forming the via hole and the trench.

However, due to the small size of the interconnections, a critical dimension (CD) of the via hole gets smaller. Polymer remains inside the via hole as an etch by-product generated inside during the formation of the via hole, which causes defects. If an excessive chemical process is performed to remove the polymer residue inside the via hole, a sidewall of the via hole becomes rough, and the hole becomes narrow.

In addition, a barrier metal may be deposited before the insides of the trench and the via hole are filled with a copper layer. Since the polymer residue makes it difficult to remove the etch stop layer, the barrier metal may not be uniformly deposited, which will lower the yield of products.

Those limitations are caused because it is difficult to completely remove the polymer residue generated as a process by-product. Meanwhile, void issues may be caused by a by-product generated by secondary contamination in a wet etching process.

SUMMARY

Embodiments provide a method for fabricating a metal interconnection of a semiconductor device, which is capable of improving surface uniformity of a via hole by removing polymer remaining inside the via hole. Embodiments also provide a method for fabricating a metal interconnection of a semiconductor device, which is capable of improving the yield and reliability of the semiconductor device by minimizing surface roughness of a via hole.

In embodiments, a method for fabricating a metal interconnection of a semiconductor device includes: forming a lower interconnection and a lower insulation layer over a semiconductor substrate; forming an etch stop layer over the lower insulation layer; forming an upper insulation layer over the etch stop layer; forming a first via hole to expose the etch stop layer corresponding to the lower interconnection; forming a second via hole exposing the lower interconnection by a primary etching process that selectively removes the etch stop layer exposed by the first via hole; performing a cleaning process using chemical on the second via hole, wherein polymer is formed over the surface of the lower interconnection during the cleaning process; and removing the polymer from the second via hole by a secondary etching process using vaporized gas.

Embodiments relate to an apparatus configured to form a lower interconnection and a lower insulation layer over a semiconductor substrate, form an etch stop layer over the lower insulation layer, form an upper insulation layer over the etch stop layer, form a first via hole to expose the etch stop layer corresponding to the lower interconnection, form a second via hole exposing the lower interconnection by a primary etching process that selectively removes the etch stop layer exposed by the first via hole, perform a cleaning process using chemical on the second via hole, wherein polymer is formed over the surface of the lower interconnection during the cleaning process, and remove the polymer from the second via hole by a secondary etching process using vaporized gas.

DRAWINGS

Example FIGS. 1 to 5 are cross-sectional views illustrating a method for fabricating a metal interconnection of a semiconductor device according to embodiments.

DESCRIPTION

A method for fabricating a metal interconnection of a semiconductor device according to embodiments will be described in detail with reference to example FIGS. 1 to 5. Referring to example FIG. 1, an etch stop layer 40 may be formed over a semiconductor substrate 10 in which a lower interconnection 30 and a lower insulation layer 20 may be formed.

A device isolation layer defining an active region and a field region may be formed in the semiconductor substrate 10. A source, a drain and a gate electrode of a transistor may be formed in the active region.

The lower insulation layer 20 over the semiconductor substrate 10 may include an insulation layer such as an oxide layer or a nitride layer. Also, the lower interconnection 30 may pass through the lower insulation layer 20 and be electrically connected to a transistor. For example, the lower interconnection 30 may be formed of various conductive materials containing metal, alloy or silicide, for example, aluminum, copper, cobalt, or tungsten.

The etch stop layer 40 may be formed over the lower insulation layer 20 and the lower interconnection 30, and protect the lower interconnection 30 in a subsequent process. For example, the etch stop layer 40 may be formed of nitride (SiN). An upper insulation layer 50 may be formed over the etch stop layer 40. A trench 60 and a first via hole 70 may be formed through a dual damascene process. For example, the upper insulation layer 50 may be formed of oxide or nitride.

For reference, examples of the damascene process include a via first dual damascene process, a trench first dual damascene process, and a self-aligned dual damascene process. Example FIG. 1 illustrates an example in which the trench and the first via hole are formed through a trench first dual damascene process.

A first photoresist pattern may be formed over the upper insulation layer 50. The trench 60 may be formed using the first photoresist pattern as a mask. A second photoresist pattern exposing the bottom of the trench 60 may be formed over the upper insulation layer 50 in which the trench 60 is formed, and the upper insulation layer 50 under the trench 60 may be etched using the second photoresist pattern as a mask to thereby form the first via hole 70. When forming the first via hole 70, the etching process may be stopped by the etch stop layer 40. Therefore, the surface of the etch stop layer 40 corresponding to the lower interconnection 30 may be exposed by the first via hole 70.

Figure 2:
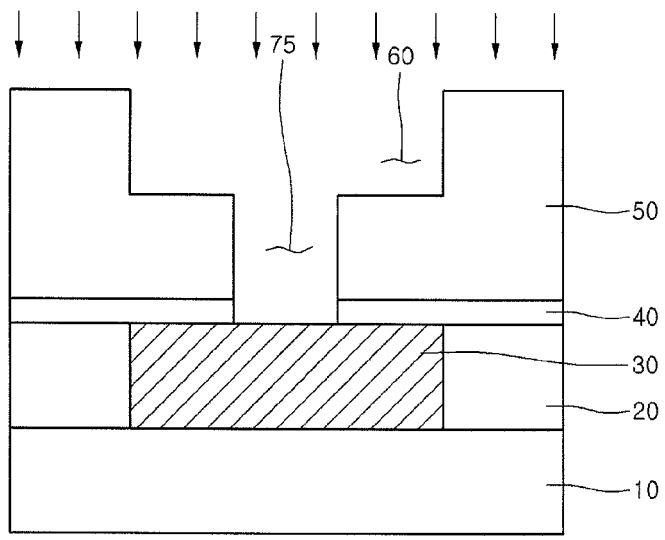

Referring to example FIG. 2, the etch stop layer 40 is selectively removed to expose the lower interconnection 30, thereby forming a second via hole 75. That is, the etch stop layer 40 under the first via hole 70 may be selectively etched to expose the lower interconnection 30.

The second via hole 75 may be formed by a primary etching process and a cleaning process. For example, the primary etching process may be a reactive ion etching process that selectively etches the etch stop layer 40 exposed by the first via hole 70. The second via hole 75 may be formed by performing a cleaning process using chemical to remove polymer that is a by-product generated during the reactive ion etching process.

The cleaning process may be performed using chemical such as DHF, DHCl, and $DNH_4OH$. For example, polymer generated during the primary etching process may be removed by performing a primary cleaning process using the DHF chemical, and particles may be removed by performing a secondary cleaning process using the DHCl chemical. Also, the surface of the second via hole 75 may be treated by performing a tertiary cleaning process using the $DNH_4OH$ chemical.

Therefore, the particle and roughness problem is solved by the second via hole 75 formed through the reactive ion etching process and the cleaning process. If the cleaning process is performed, polymer 80 may be formed by the following reaction of the nitride (SiN) layer used as the etch stop layer 49 with the chemical used in the cleaning process.

Figure 3:
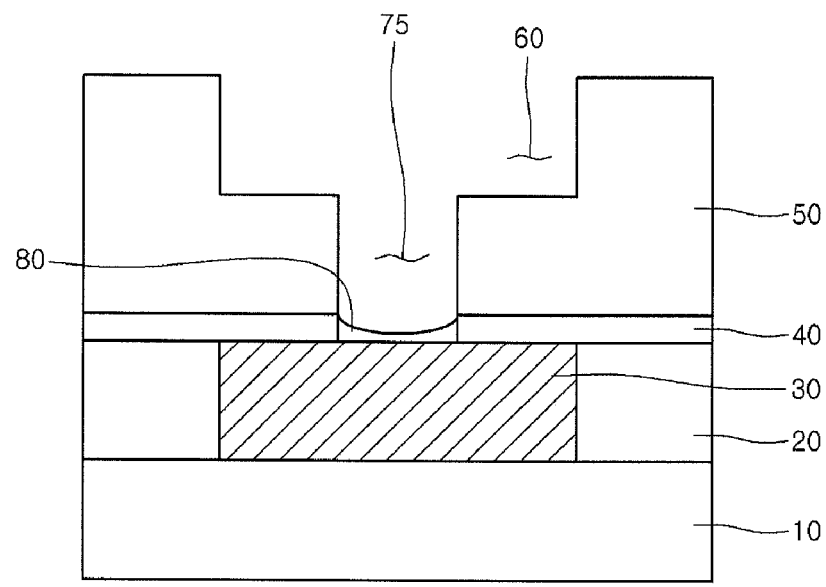

As illustrated in example FIG. 3, SiOF is formed by the reaction of SiN with HF, and a $SiO_2$ layer is formed as polymer over the lower interconnection 30 by the reaction of SiOF with HF. If the oxide ($SiO_2$) layer is formed over the lower interconnection 30, it may cause defects and undesired particles in a subsequent process of forming a barrier layer 90. For this reason, the oxide layer must be removed.

Figure 4:
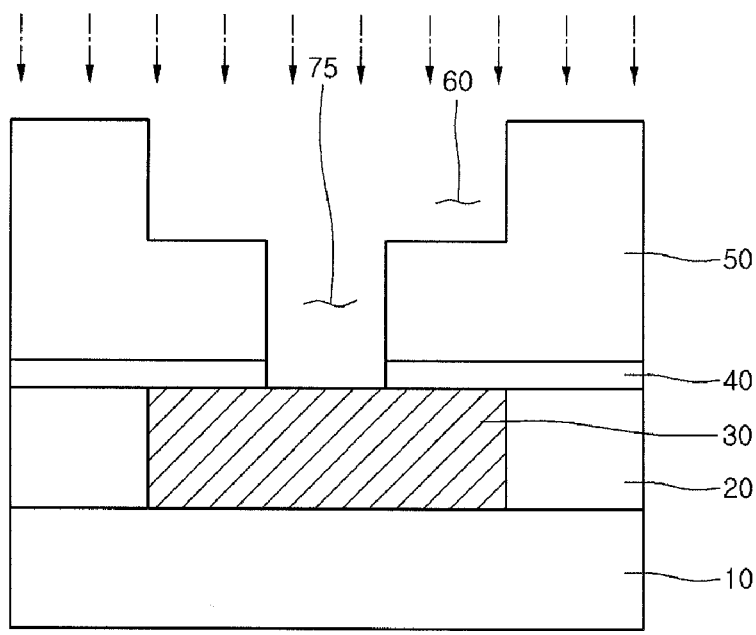

Referring to example FIG. 4, a secondary etching process may be performed to remove the polymer 80 disposed over the lower interconnection 30. The second etching process may be performed using volatile DHF (VPC), and it may selectively remove the oxide ($SiO_2$) layer constituting the polymer 80.

Specifically, only the polymer 80 may be selectively removed by the secondary etching process that supplies 39.6% vaporized HF to the semiconductor substrate 10 at a temperature of about 30° C. to about 50° C. for about 5 seconds to about 50 seconds. For example, the VPC may have a deionized water (DI) to HF ratio of 2:1.

In the case of a batch type using a general DHF chemical, the DHF chemical penetrates up to the lower interconnection 30 disposed under the oxide layer, which causes damage to the lower interconnection 30. However, in the case of the VPC process, volatile DHF may be supplied in a gas phase to the surface of the polymer 80 to be etched. Thus, only the oxide layer existing as a thin film may be selectively removed. In addition, the VPC process may remove only the polymer 80 over the surface of the lower interconnection 30 because a selectivity of the oxide layer to the nitride layer is high according to a vaporization or evaporation temperature.

Furthermore, since the VPC is in a gas phase, volatile DHF can be applied only to the oxide layer to be etched, and thus, the polymer 80 of the narrow second via hole 75 can be processed. The surface uniformity of the second via hole 75 is improved by completely removing the polymer 80 and particles inside the second via hole 75 through the primary and secondary etching processes. Moreover, the roughness of the second via hole 75 may be reduced because only the polymer 80 will be selectively removed by the VPC process.

Figure 5:
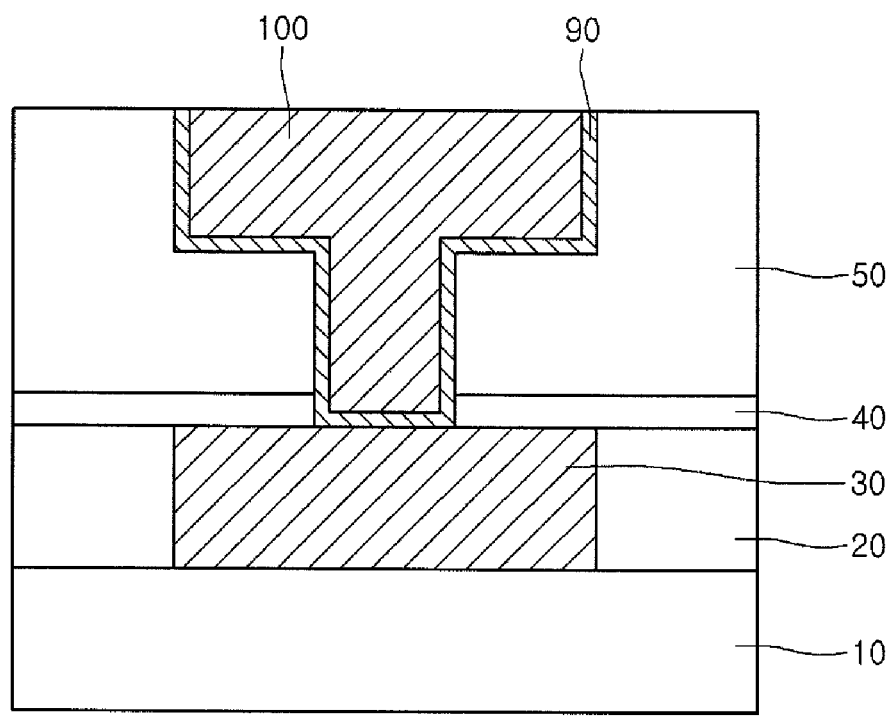

Referring to example FIG. 5, a barrier layer 90 may be formed along the surfaces of the trench 60 and the second via hole 75. The barrier layer 90 may be formed by depositing Ta/TaN or TaSiN through a physical vapor deposition (PVD) process. Since the barrier layer 90 is formed along the uniform surfaces of the trench 60 and the second via hole 75, it can be deposited with good quality.

A seed layer may be formed along a stepped portion of the barrier layer 90 so as to facilitate the deposition of a metal over the barrier layer 90 in a subsequent process. For example, the seed layer may be formed by depositing copper (Cu), gold (Au) or platinum (Pt).

A copper layer may be deposited over the barrier layer 90 to gap-fill the trench 60 and the second via hole 75, and a CMP process may be performed to form an upper interconnection 100.

The deposition characteristic of the barrier layer 90 is improved since the barrier layer 90 may be formed with the particles and polymer removed from the insides of the trench 60 and the second via hole 75. Therefore, adhesion of the copper layer formed over the barrier layer 90 is increased, and formation of voids is prevented, thereby improving the electrical property and yield of the device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a lower interconnection and a lower insulation layer over a semiconductor substrate;
    forming an etch stop layer over the lower insulation layer;
    forming an upper insulation layer over the etch stop layer;
    forming a first via hole to expose the etch stop layer corresponding to the lower interconnection;
    forming a second via hole exposing the lower interconnection by a primary etching process that selectively removes the etch stop layer exposed by the first via hole;
    performing a cleaning process using chemical on the second via hole, wherein polymer is formed over the surface of the lower interconnection during the cleaning process; and
    removing the polymer from the second via hole by a secondary etching process using vaporized gas.

2. The method of claim 1, including:
    forming a barrier layer along the surface of the second via hole; and
    forming an upper interconnection over the barrier layer, thereby filling the second via hole.

3. The method of claim 1, wherein the etch stop layer includes a nitride layer.

4. The method of claim 1, wherein the polymer includes an oxide layer.

5. The method of claim 1, wherein the primary etching process includes a reactive ion etching process.

6. The method of claim 1, wherein the cleaning process is performed using DHF.

7. The method of claim 1, wherein the cleaning process is performed using at least one of DHF, DHCL, and $DNH_4OH$.

8. The method of claim 1, wherein the secondary etching process is performed vaporized DHF.

9. The method of claim 1, wherein the secondary etching process is performed using vaporized DHF at a temperature of about 30° C. to about 50° C.

10. The method of claim 1, wherein the secondary etching process is performed using vaporized DHF for about 5 seconds to 50 seconds.

11. The method of claim 1, wherein in the secondary etching process, deionized water and HF are mixed at a ratio of 2:1.

12. The method of claim 2, wherein the upper interconnection is formed of copper.

\* \* \* \* \*